(12) United States Patent
Wang et al.

(10) Patent No.: US 11,231,748 B2
(45) Date of Patent: Jan. 25, 2022

(54) DISPLAY DEVICE, STRETCHABLE DISPLAY PANEL AND FABRICATING METHOD THEREOF

(71) Applicant: BOE TECHNOLOGY GROUP CO., LTD., Beijing (CN)

(72) Inventors: Xiaofen Wang, Beijing (CN); Xiaohu Li, Beijing (CN); Haibin Zhu, Beijing (CN); Wei Wang, Beijing (CN); Kai Sui, Beijing (CN); Jingkai Ni, Beijing (CN); Qian Jin, Beijing (CN); Xiaoyun Liu, Beijing (CN); Xiaoyan Zhu, Beijing (CN); Weikang Xiao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 137 days.

(21) Appl. No.: 16/807,534

(22) Filed: Mar. 3, 2020

(65) Prior Publication Data

US 2021/0064091 A1    Mar. 4, 2021

(30) Foreign Application Priority Data

Aug. 30, 2019    (CN) .......................... 201910817741.1

(51) Int. Cl.
*G06F 1/16*    (2006.01)
*G09F 9/30*    (2006.01)

(52) U.S. Cl.
CPC .......... *G06F 1/1652* (2013.01); *G06F 1/1609* (2013.01); *G09F 9/301* (2013.01)

(58) Field of Classification Search
CPC ... G06F 1/1609; G06F 1/1652; G09G 3/3266; G09G 3/3275; G09F 9/30; G09F 9/301;
(Continued)

(56) References Cited

U.S. PATENT DOCUMENTS

| 2012/0061664 A1* | 3/2012 | Yamazaki | ........... H01L 27/3248 257/43 |
| 2012/0062814 A1* | 3/2012 | Yamazaki | ........... H01L 27/1259 349/43 |

(Continued)

FOREIGN PATENT DOCUMENTS

CN    109755412 A  *  5/2019

*Primary Examiner* — Joe H Cheng
(74) *Attorney, Agent, or Firm* — Thomas | Horstemeyer, LLP

(57) ABSTRACT

A display device, a stretchable display panel, and a fabricating method thereof are described. The stretchable display panel includes a flexible substrate and a plurality of pixel islands and island-to-island connections disposed on the flexible substrate. The island-to-island connections include a first outer protective layer disposed on the flexible substrate; a first inner protective layer disposed on a surface of the first outer protective layer facing away from the flexible substrate; a conductive layer disposed on a part of a surface of the first inner protective layer facing away from the flexible substrate; a second inner protective layer configured to cover the conductive layer and the first inner protective layer; a second outer protective layer disposed on a surface of the second inner protective layer facing away from the flexible substrate; and a packaging layer configured to cover the second outer protective layer.

20 Claims, 2 Drawing Sheets

(58) Field of Classification Search
CPC ............... H01L 27/124; H01L 27/3237; H01L 27/3276; H01L 51/003; H01L 51/0097; H01L 51/5253; H01L 51/56; H01L 2227/323; H05K 2201/10128
See application file for complete search history.

(56) References Cited

U.S. PATENT DOCUMENTS

| | | | |
|---|---|---|---|
| 2017/0358641 A1* | 12/2017 | Park | H01L 27/3276 |
| 2018/0097199 A1* | 4/2018 | Jo | H01L 27/3276 |
| 2019/0041915 A1* | 2/2019 | Park | H01L 27/124 |
| 2019/0280075 A1* | 9/2019 | Chung | H01L 51/5256 |
| 2020/0135835 A1* | 4/2020 | Seo | H01L 51/5253 |
| 2020/0243778 A1* | 7/2020 | Li | H01L 27/3276 |
| 2020/0409419 A1* | 12/2020 | He | G09F 9/301 |
| 2021/0056873 A1* | 2/2021 | Jung | H01L 27/3276 |

* cited by examiner

ID_DISPLAY DEVICE, STRETCHABLE DISPLAY
PANEL AND FABRICATING METHOD
THEREOF

CROSS REFERENCE TO RELATED
APPLICATION

This application is based upon and claims priority to Chinese Patent Application No. 201910817741.1, filed on Aug. 30, 2019, where the entire contents thereof are incorporated herein by reference.

TECHNICAL FIELD

The present disclosure relates to the technical field of display and, more specifically, relates to a display device, a stretchable display panel, and a fabricating method of the stretchable display panel.

BACKGROUND

At present, stretchable display panels have received widespread attention. Stretchable display panels generally include a plurality of pixel islands, where each pixel island includes a plurality of pixels, and the pixel islands are connected through island-to-island connections. Because the pixel islands are hollow structures, they can be stretched. However, for existing stretchable display panels, during the stretching process, the island-to-island connection is prone to stress concentration, and cracks and fractures may occur, which affects the normal display.

It should be noted that the information disclosed in the background section above is only used to enhance the understanding of the background of the present disclosure, and therefore may include information that does not constitute related technology known to those skilled in the art.

SUMMARY

According to one aspect of the present disclosure, a stretchable display panel is provided that includes: a flexible substrate, a plurality of pixel islands and island-to-island connections disposed on the flexible substrate, where the island-to-island connections are configured to connect adjacent pixel islands; the island-to-island connections include: a first outer protective layer disposed on the flexible substrate; a first inner protective layer disposed on a surface of the first outer protective layer facing away from the flexible substrate; a conductive layer disposed on a part of a surface of the first inner protective layer facing away from the flexible substrate; a second inner protective layer configured to cover the conductive layer and the first inner protective layer; a second outer protective layer disposed on a surface of the second inner protective layer facing away from the flexible substrate; and a packaging layer configured to cover the second outer protective layer. The Young's modulus of the first inner protective layer and the second inner protective layer are lower than that of the first outer protective layer and the second outer protective layer. The Young's modulus of the first outer protective layer and the second outer protective layer are lower than that of the packaging layer.

In an exemplary embodiment of the present disclosure, the first inner protective layer and the second inner protective layer are both made of material with elastic and hydrophobic properties.

In an exemplary embodiment of the present disclosure, a material of at least one of the first inner protective layer and the second inner protective layer includes at least one of polydimethylsiloxane silicone and polyurethane.

In an exemplary embodiment of the present disclosure, a material of at least one of the first outer protective layer and the second outer protective layer includes at least one of polyimide and naphthoquinone diazide compound.

In an exemplary embodiment of the present disclosure, materials of the first inner protective layer and the second inner protective layer are the same, and materials of the first outer protective layer and the second outer protective layer are the same.

In an exemplary embodiment of the present disclosure, a material of the packaging layer includes at least one of silicon oxide, silicon oxynitride, and silicon nitride.

In an exemplary embodiment of the present disclosure, the pixel islands include: an active layer disposed on the flexible substrate; a gate insulating layer disposed on a side of the active layer facing away from the flexible substrate and configured to cover the active layer and the flexible substrate; a gate disposed on a surface of the gate insulating layer facing away from the flexible substrate; an interlayer insulating layer disposed on a surface of the gate facing away from the flexible substrate and configured to cover the gate and the gate insulating layer; a source electrode, a drain electrode, and a signal line, which are disposed on a surface of the interlayer insulating layer facing away from the flexible substrate; and a light emitting layer configured to cover the source electrode, the drain electrode, the signal line, and the interlayer insulating layer.

According to another aspect of the present disclosure, a fabricating method of the stretchable display panel is provided, the fabricating method including: forming a flexible substrate on a substrate, the flexible substrate having a plurality of island regions and bridge regions connecting adjacent island regions; forming a first outer protective layer; forming a first inner protective layer on a surface of the first outer protective layer facing away from the flexible substrate; forming a conductive layer on a part of the surface of the first inner protective layer facing away from the flexible substrate; forming a second inner protective layer covering the conductive layer and the first inner protective layer; forming a second outer protective layer on a surface of the second inner protective layer facing away from the flexible substrate; forming a packaging layer on a surface of the second outer protective layer facing away from the flexible substrate; peeling the flexible substrate from the substrate. The Young's modulus of the first inner protective layer and the second inner protective layer are lower than that of the first outer protective layer and the second outer protective layer. The Young's modulus of the first outer protective layer and the second outer protective layer are lower than that of the packaging layer.

In an exemplary embodiment of the present disclosure, the first inner protective layer and the second inner protective layer are both made of a material with elastic and hydrophobic properties.

In an exemplary embodiment of the present disclosure, the fabricating method further includes: forming an active layer in the island region; forming a gate insulating layer covering the active layer and the island region; forming a gate on a surface of the gate insulating layer facing away from the flexible substrate; forming an interlayer insulating layer covering the gate and the gate insulating layer; forming a source electrode, a drain electrode, and a signal line on a surface of the interlayer insulating layer facing away from the flexible substrate; forming a light emitting layer covering the source electrode, the drain electrode, the signal line, and the interlayer insulating layer; where the source electrode, the drain electrode, the signal line, and the conductive layer are formed by a same patterning process.

In an exemplary embodiment of the present disclosure, a material of at least one of the first inner protective layer and the second inner protective layer includes at least one of polydimethylsiloxane silicone and polyurethane.

In an exemplary embodiment of the present disclosure, a material of at least one of the first outer protective layer and the second outer protective layer includes at least one of polyimide and naphthoquinone diazide compound.

In an exemplary embodiment of the present disclosure, materials of the first inner protective layer and the second inner protective layer are the same, and materials of the first outer protective layer and the second outer protective layer are the same.

In an exemplary embodiment of the present disclosure, a material of the packaging layer includes at least one of silicon oxide, silicon oxynitride, and silicon nitride.

According to another aspect of the present disclosure, a display device is provided, which includes a stretchable display panel according to any one of the above-described aspects.

It should be understood that the above general description and the following detailed description are merely exemplary and explanatory, and should not limit the present disclosure.

BRIEF DESCRIPTION OF THE DRAWINGS

The drawings herein are incorporated in and constitute a part of this specification, illustrate embodiments consistent with the present disclosure, and together with the description serve to explain the principles of the present disclosure. Understandably, the drawings in the following description are just some embodiments of the present disclosure. For those of ordinary skill in the art, other drawings can be obtained according to these drawings without creative effort.

DETAILED DESCRIPTION

Figure 1:
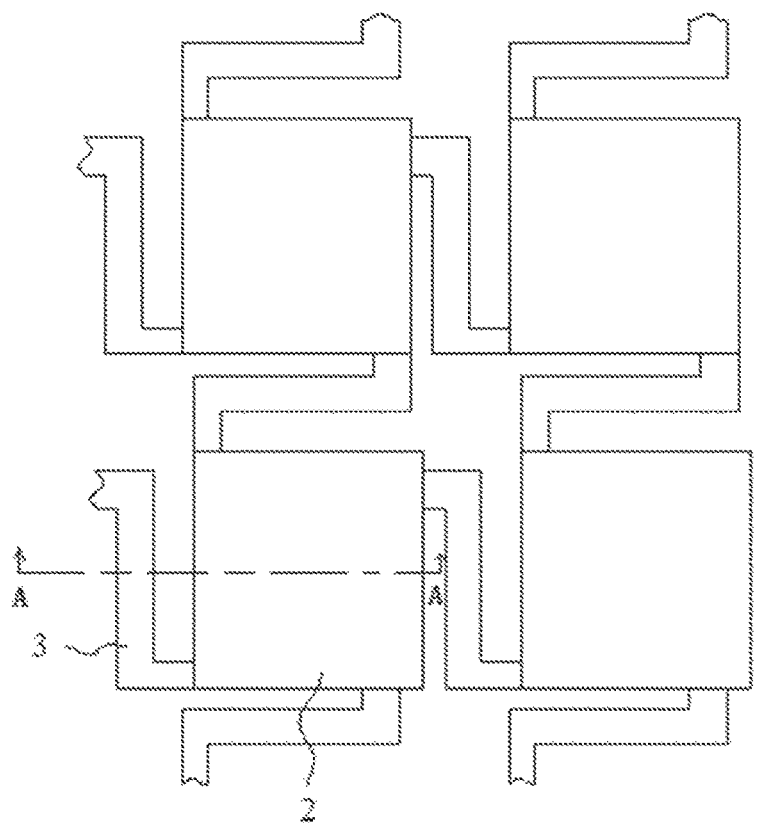
FIG. 1 is a schematic top view of an embodiment of a display panel of the present disclosure.

Example embodiments will now be described more fully with reference to the accompanying drawings. However, the exemplary embodiments can be implemented in various forms and should not be construed as limited to the embodiments set forth herein. Rather, these embodiments are provided so that the present disclosure will be thorough and complete, and will fully convey the concept of example embodiments to those skilled in the art. The same reference numerals in the drawings denote the same or similar structures, and thus their detailed descriptions will be omitted. In addition, the drawings are merely schematic illustrations of the present disclosure and are not necessarily drawn to scale.

Although relative terms are used in this specification, such as "up" and "down" to describe the relative relationship between one component and another component of an icon, these terms are used in this specification for convenience only, for example according to the directions of the examples described in the drawings. It can be understood that if the device of the icon is turned upside down, the component described "up" will become the component "down". When a structure is "on" another structure, it may mean that a structure is integrally formed on another structure, or that a structure is "directly" arranged on another structure, or that a structure is arranged "indirectly" on another structure through another structure.

The terms "a", "an", "the", and "said" are used to indicate that there are one or more elements/components/etc. The terms "comprising" and "having" are used to indicate open-ended inclusion, and means that in addition to the listed elements/components/etc., there may be other elements/components/etc. The terms "first" and "second" are used only as labels or markers, and not as a limitation on the number of objects.

Figure 2:
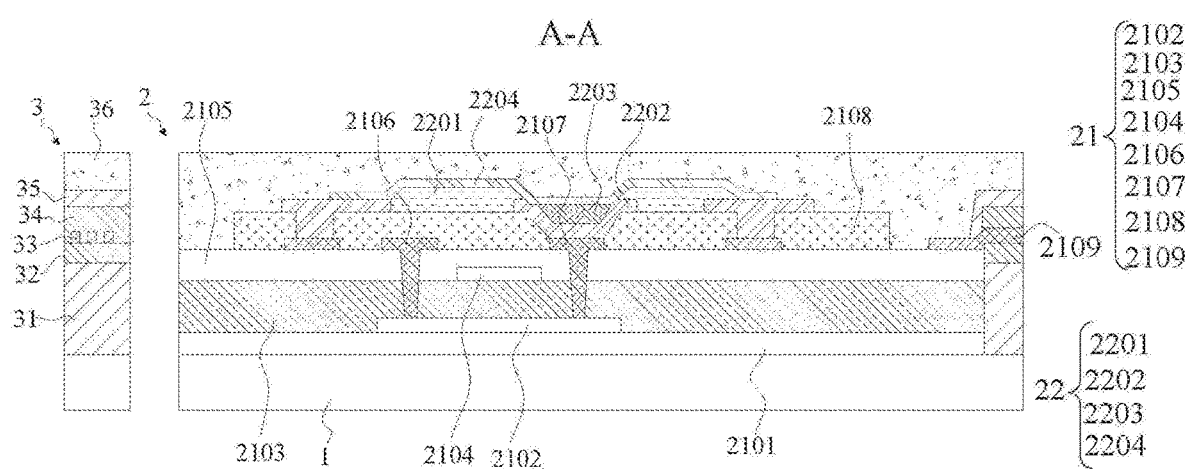
FIG. 2 is a schematic cross-sectional view taken along line A-A of an embodiment of a display panel of the present disclosure.

An embodiment of the present disclosure provides a stretchable display panel. As shown in FIG. 1 and FIG. 2, the stretchable display panel includes a flexible substrate 1, pixel islands 2, and island-to-island connection(s) 3. The number of pixel islands 2 is a plurality and the pixel islands 2 are distributed on the flexible substrate 1 in an array. The island-to-island connection(s) 3 are also provided on the flexible substrate 1, and adjacent pixel islands 2 are connected by the island-to-island connection(s) 3. The island-to-island connection(s) 3 include a first outer protective layer 31, a first inner protective layer 32, a conductive layer 33, a second inner protective layer 34, a second outer protective layer 35, and a packaging layer 36.

In one embodiment, the first outer protective layer 31 is disposed on the flexible substrate 1. The first inner protective layer 32 is disposed on a surface of the first outer protective layer 31 facing away from the flexible substrate 1. The conductive layer 33 is disposed on a part of the surface of the first inner protective layer 32 facing away from the flexible substrate 1. The second inner protective layer 34 is configured to cover the conductive layer 33 and the first inner protective layer 32. The second outer protective layer 35 is disposed on a surface of the second inner protective layer 34 facing away from the flexible substrate 1. The packaging layer 36 covers the island-to-island connections 3 and the pixel islands 2.

The Young's modulus of the first inner protective layer 32 and the second inner protective layer 34 are lower than that of the first outer protective layer 31 and the second outer protective layer 35. The Young's modulus of the first outer protective layer 31 and the second outer protective layer 35 are lower than that of the packaging layer 36.

The stretchable display panel according to the embodiment of the present disclosure can connect two adjacent pixel islands 2 through an island-to-island connection 3, where the conductive layer 33 in the island-to-island connection 3 serves as an electrical connection. The first outer protective layer 31 and the second outer protective layer 35 may constitute an outer protective layer that protects the conductive layer 33 from both sides. The first inner protective layer 32 and the second inner protective layer 34 may constitute an inner protective layer that protects the conductive layer 33 within the outer protective layer. The packaging layer 36 can protect from the outside of the first outer protective layer 31, thereby achieving multi-layer protection.

In one embodiment, the first inner protective layer 32 and the second inner protective layer 34 are both made of a material with elastic and hydrophobic properties. In one embodiment, the material with elastic and hydrophobic properties may include at least one of polydimethylsiloxane silicone and polyurethane. Understandably, embodiments of the present disclosure are not limited to these two materials.

Because the inner protective layers are made of a material with elastic and hydrophobic properties having a Young's modulus lower than that of the outer protective layer, the inner protective layer has higher elasticity than the outer protective layer. So even if cracks are formed in the outer protective layer, it is difficult to form cracks in the inner protective layer. Therefore, external water oxygen (water vapor and oxygen) is prevented from contacting the conductive layer 33 through cracks and corrosion of the conductive layer 33 is prevented, and, as such, the display panel works normally.

Each part of the stretchable display panel according to the embodiment of the present disclosure is described in detail below.

As shown in FIG. 2, the flexible substrate 1 has a plurality of island regions distributed in an array and a bridge region(s) connecting adjacent island regions. The flexible substrate 1 may be a flexible transparent material, such as PI (polyimide), PET (polyethylene terephthalate), and the like.

The number of the pixel islands 2 is a plurality, and the plurality of the pixel islands are disposed in each island region in a one to one correspondence. Two adjacent pixel islands 2 are separated by a bridge region. Each pixel island 2 includes a driving layer 21 and a light emitting layer 22.

In one embodiment, the driving layer 21 is provided on one side of the flexible substrate 1 and may be directly provided on the surface of the flexible substrate 1 or on the surface of the buffer layer 2101 provided on the flexible substrate 1 facing away from the flexible substrate 1. The material of the buffer layer 2101 may include one or more of silicon oxide, silicon nitride, and aluminum oxide.

As shown in FIG. 2, the driving layer 21 includes a plurality of thin film transistors distributed in an array, and the type may be a top-gate type or a bottom-gate type, which is not particularly limited herein. Taking a top-gate thin film transistor as an example: the driving layer 21 may include an active layer 2102, a gate insulating layer 2103, a gate 2104, an interlayer insulating layer 2105, and a source-drain layer that are sequentially stacked in a direction away from the flexible substrate 1. The source-drain layer includes a source electrode 2106 and a drain electrode 2107 connected to both ends of the active layer 2102 through vias. The active layer 2102 may be made of an inorganic semiconductor material (amorphous silicon and polycrystalline silicon), an organic semiconductor material, and/or an oxide-containing semiconductor material (such as Zn, In, Ga, etc.).

Further, the driving layer 21 may further include a flat layer 2108 covering the source-drain layer. The specific working principle of the thin film transistor is not described in detail here. In addition, the driving layer 21 may further include a signal line(s) 2109, where the signal line 2109 may be disposed on the same layer as the source-drain layer so as to be formed through a patterning process in a time. The signal line 2109 can be connected to the source electrode 2106 for outputting a driving signal to the source electrode 2106. The material of the signal line 2019 can be a conductive metal such as Ti, Al, Mo, Ag, or a conductive oxide such as ITO, IZO, ZnO, In$_2$O$_3$, IGO, and AZO.

As shown in FIG. 2, the light emitting layer 22 is disposed on a surface of the driving layer 21 facing away from the flexible substrate 1, and is configured to emit light under the driving of the driving layer 21 to display an image. For example, the light emitting layer 22 may include a pixel definition layer 2201, an anode layer 2202, a light emitting function layer 2203, and a cathode layer 2204.

In one embodiment, the pixel definition layer 2201 and the anode layer 2202 are both disposed on a surface of the driving layer 21 facing away from the flexible substrate 1, for example, disposed on a surface of the flat layer 2108 facing away from the flexible substrate 1. The anode layer 2202 has a plurality of electrode units distributed in an array, and the pixel definition layer 2201 has pixel regions exposed one to one corresponding to each electrode unit. Each electrode unit is connected to the drain electrode 2107 of each thin film transistor in a one-to-one correspondence. The material of the pixel definition layer 2201 may be a polyacrylic resin or a polyimide resin.

The number of the light emitting function layers 2203 is a plurality and the light emitting function layers 2203 are configured to be filled in each pixel region one-to-one correspondingly. The light emitting function layer 2203 may include a hole injection layer, a hole transport layer, an organic light emitting layer, an electron transport layer, and an electron injection layer which are sequentially stacked on the anode layer 2202.

The cathode layer 2204 is configured to cover the pixel definition layer 2201 and the light emitting function layer 2203, so that the pixel definition layer 2201 may define a plurality of sub-pixels corresponding to each pixel region.

As shown in FIG. 1 and FIG. 2, the island-to-island connection(s) 3 is also provided on the flexible substrate 1 and are located in a region other than the pixel islands 2, and adjacent pixel islands 2 can be connected by the island-to-island connection(s) 3. The island-to-island connection(s) 3 may include a first outer protective layer 31, a first inner protective layer 32, a conductive layer 33, a second inner protective layer 34, a second outer protective layer 35, and a packaging layer 36.

In one embodiment, as shown in FIG. 2, the first outer protective layer 31 is disposed on the flexible substrate 1. The material of the first outer protective layer 31 may be a material having a high Young's modulus such that it is not easy to form cracks or breaks. For example, the material of the first outer protective layer 31 may include at least one of polyimide and naphthoquinone diazide compound.

As shown in FIG. 2, the first inner protective layer 32 is disposed on a surface of the first outer protective layer 31 facing away from the flexible substrate 1, and the first inner protective layer 32 is made of material with elastic and hydrophobic properties. For example, the material of the first inner protective layer 32 includes at least one of polydimethylsiloxane silicone and polyurethane. The polyurethane may be a thermoplastic polyurethane in some embodiments. Of course, the first inner protective layer 32 may also use other materials capable of achieving the same function.

As shown in FIG. 2, the conductive layer 33 may be disposed in a local area of the surface of the first inner protective layer 32 facing away from the flexible substrate 1, that is, the first inner protective layer 32 is not completely covered. At the same time, the conductive layer 33 may be electrically connected to the pixel island 2 to realize signal transmission. The pattern of the conductive layer 33 is not particularly limited herein. For example, the conductive layer 33 may be disposed on the same layer as the source-drain layer in the pixel island 2 and each is connected to the source electrode 2106.

As shown in FIG. 2, the second inner protective layer 34 is configured to cover the conductive layer 33 and the first inner protective layer 32, that is, cover the surface of the conductive layer 33 facing away from the flexible substrate 1 and the region of the first inner protective layer 32 which is not covered by the conductive layer 33. At the same time, the second inner protective layer 34 is also made of a material with elastic and hydrophobic properties. For example, the material of the second inner protective layer 34 may include at least one of polydimethylsiloxane silicone and polyurethane. The polyurethane may be a thermoplastic polyurethane. Of course, the second inner protective layer 34 may also use other materials capable of achieving the same function.

As shown in FIG. 2, the second outer protective layer 35 is disposed on a surface of the second inner protective layer 34 facing away from the flexible substrate 1. The material of the second outer protective layer 35 may be a material having a high Young's modulus, such that it is not easy to form cracks or breaks. For example, the material of the second outer protective layer 35 may include at least one of polyimide and naphthoquinone diazide compound.

As shown in FIG. 2, the first outer protective layer 31 and the second outer protective layer 35 may be used as outer protective layers of the conductive layer 33, and may protect from both sides of the conductive layer 33. The first inner protective layer 32 and the second inner protective layer 34 may be used as inner protective layers of the conductive layer 33. The inner protective layer protects the conductive layer 33 inside the outer protective layer. The Young's modulus of both the first inner protective layer 32 and the second inner protective layer 34 is lower than that of the first outer protective layer 31 and the second outer protective layer 35, so that the inner protective layer has better elasticity, is less likely to form cracks even if cracks are formed in the outer protective layer (at least one of the first outer protective layer 31 and the second outer protective layer 35), and it is difficult for the inner protective layer to form cracks, thereby preventing water and oxygen from contacting the conductive layer 33 through the cracks and corroding the conductive layer 33.

In one embodiment, the materials of the first inner protective layer 32 and the second inner protective layer 34 are the same, and the materials of the first outer protective layer 31 and the second outer protective layer 35 are the same, so as to ensure the protective effect of the conductive layer 33 balance. For example, the materials of the first inner protective layer 32 and the second inner protective layer 34 are polydimethylsiloxane silicone, and the materials of the first outer protective layer 31 and the second outer protective layer 35 are polyimide.

As shown in FIG. 2, the packaging layer 36 may cover the second inner protective layer 34, and may further protect from outside the second outer protective layer 35. The Young's modulus of the first outer protective layer 31 and the second outer protective layer 35 are lower than that of the packaging layer 36, so that the packaging layer 36 is more difficult to deform than the inner protective layer and outer protective layer described above. For example, the material of the packaging layer 36 includes at least one of silicon oxide, silicon oxynitride and silicon nitride.

In addition, as shown in FIG. 2, the packaging layer 36 may also cover the pixel island 2, for example, cover the cathode layer 2204, so that the island-to-island connection 3 and the pixel island 2 may share the packaging layer 36 to simplify the process.

Figure 3:
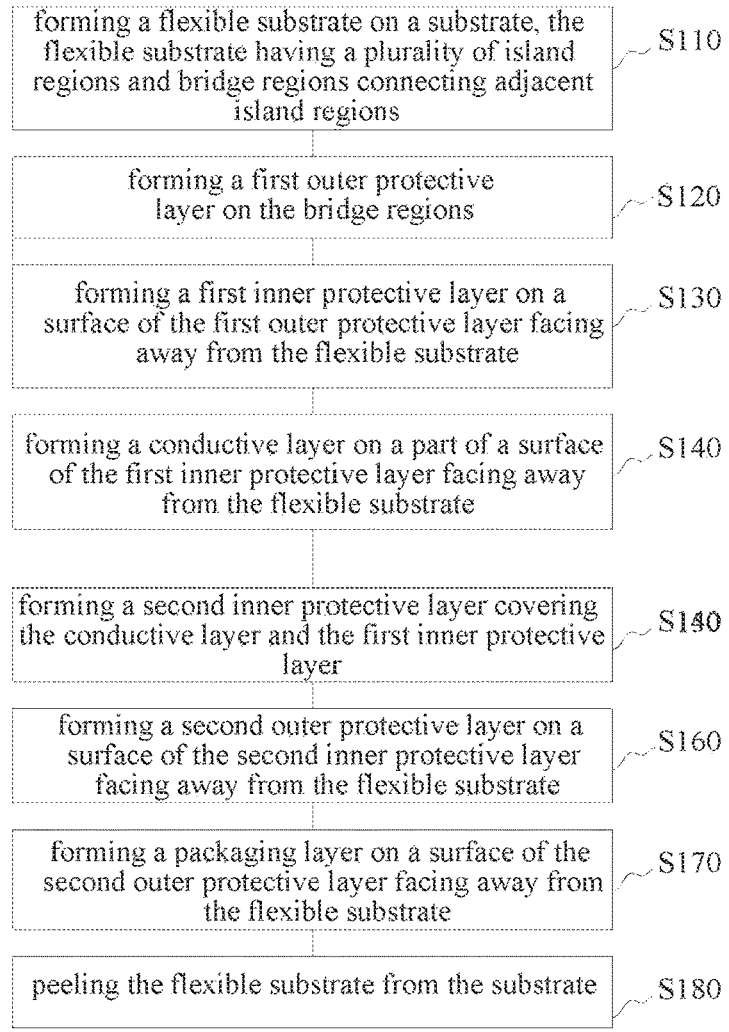
FIG. 3 is a flowchart of an embodiment of the fabricating method of the present disclosure.

An embodiment of the present disclosure provides a method for fabricating a stretchable display panel. The stretchable display panel may be the stretchable display panel of the above embodiment, and its structure is not described in detail here. As shown in FIG. 3, the fabricating method according to the embodiment of the present disclosure includes steps S110-S180, where:

Step S110: forming a flexible substrate on a substrate, the flexible substrate having a plurality of island regions and bridge regions connecting adjacent island regions;

Step S120: forming a first outer protective layer on the bridge regions;

Step S130: forming a first inner protective layer on a surface of the first outer protective layer facing away from the flexible substrate;

Step S140: forming a conductive layer on a part of a surface of the first inner protective layer facing away from the flexible substrate;

Step S150: forming a second inner protective layer covering the conductive layer and the first inner protective layer;

Step S160: forming a second outer protective layer on a surface of the second inner protective layer facing away from the flexible substrate;

Step S170: forming a packaging layer on a surface of the second outer protective layer facing away from the flexible substrate;

Step S180: peeling the flexible substrate from the substrate.

The Young's modulus of the first inner protective layer and the second inner protective layer are lower than the first outer protective layer and the second outer protective layer, and the Young's modulus of the first outer protective layer and the second outer protective layer are both lower than the packaging layer.

In one embodiment, the first inner protective layer and the second inner protective layer are made of material with elastic and hydrophobic properties. In one embodiment, the material with elastic and hydrophobic properties may include at least one of polydimethylsiloxane silicone and polyurethane, of course not limited to this.

For the beneficial effects of the fabricating method of the embodiments of the present disclosure, reference may be made to the advantageous effects of the display panel described above, which will not be described in detail here.

Figure 4:
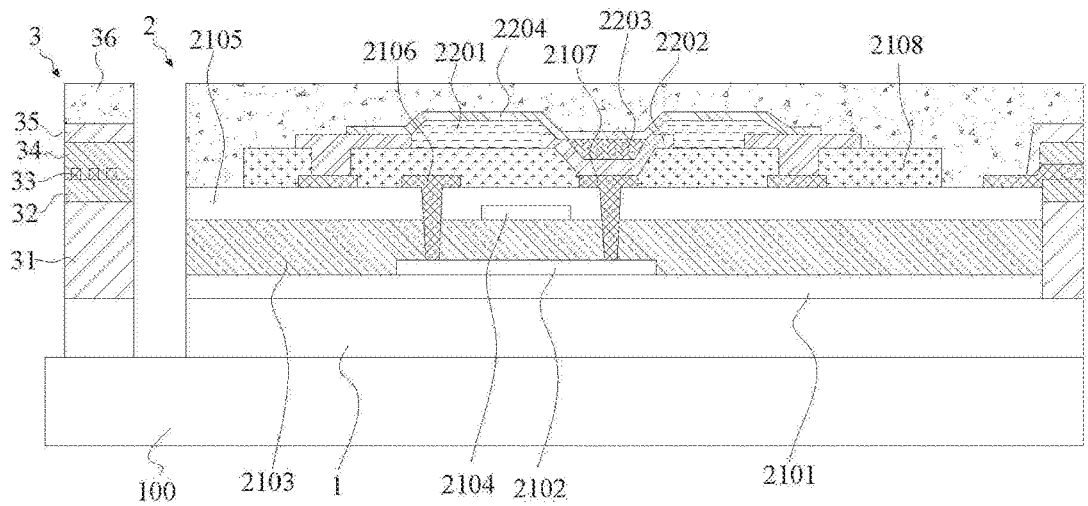
FIG. 4 is a schematic diagram of step S170 of the fabricating method of the present disclosure.

In step S110, as shown in FIG. 4, the substrate 100 may be a hard structure such as glass or silicon wafer. The structure of the flexible substrate 1 can refer to the structure in the embodiment of the display panel, which can be made in advance and attached to the substrate 100. Alternatively, the flexible substrate may be formed directly on the substrate 100, and the formation process thereof is not particularly limited herein.

In steps S120 to S170, as shown in FIG. 4, the first outer protective layer 31, the second outer protective layer 35, the first inner protective layer 32 and the second inner protective layer 34 may all be made of liquid organic materials, which can be formed by heat curing or light curing after printing. Alternatively, the layer described above can also be formed by solid organic materials through tape casting. For specific structures and materials of the first outer protective layer 31, the second outer protective layer 35, the first inner protective layer 32, and the second inner protective layer 34, reference may be made to the above embodiments of the display panel, which will not be described in detail here.

In step S180, the process of peeling the flexible substrate 1 from the substrate 100 is not particularly limited herein.

In addition, in an embodiment, the fabricating method of the present disclosure may further include steps S210 to S260, which is described as follows.

Step S210: forming an active layer in the island regions.

Step S220: forming a gate insulating layer covering the active layer and the island regions.

Step S230: forming a gate on a surface of the gate insulating layer facing away from the flexible substrate.

Step S240: forming an interlayer insulating layer covering the gate and the gate insulating layer.

Step S250: forming a source electrode, a drain electrode, and a signal line on a surface of the interlayer insulating layer facing away from the flexible substrate.

Step S260: forming a light emitting layer covering the source electrode, the drain electrode, the signal line, and the interlayer insulating layer.

In one embodiment, the source electrode, the drain electrode, the signal line, and the conductive layer are formed by a same patterning process.

As shown in FIG. 4, the structure of the driving layer has been described in the above embodiment of the display panel, and will not be described in detail here. In this embodiment, the conductive layer 33 can be formed at a time at the same time as the source 2106, the drain 2107 and the signal lines of the driving layer are formed, which simplifies the process. Of course, in other embodiments of the present disclosure, the conductive layer 33 may also be formed by adding a patterning process.

In summary, the display device, the stretchable display panel, and the fabricating method thereof of the present disclosure, adjacent two pixel islands can be connected through the island-to-island connection, and the conductive layer in the island-to-island connection plays the role of electrical connection.

The first outer protective layer and the second outer protective layer may constitute an outer protective layer that protects the conductive layer from both sides, and the first inner protective layer and the second inner protective layer may constitute an inner protective layer that protects the conductive layer within the outer protective layer. The packaging layer protects from the outside of the first outer protective layer, thereby achieving multi-layer protection.

Because the inner protective layers are made of material with elastic and hydrophobic properties having Young's modulus lower than that of the outer protective layers, the inner protective layers have higher elasticity than the outer protective layer. Therefore, even if cracks are formed on the outer protective layers, it is difficult to form cracks on the inner protective layers, thereby preventing external water and oxygen from contacting the conductive layer through the cracks, preventing corrosion of the conductive layer, and ensuring normal operation of the display panel.

It should be noted that although the steps of the method in the present disclosure are described in a specific order in the drawings, this does not require or imply that the steps must be performed in this specific order or all the steps shown must be performed to achieve the desired result. Additionally or alternatively, certain steps may be omitted, multiple steps may be combined into one step for execution, and/or one step may be broken into multiple steps for execution, etc.

An embodiment of the present disclosure further provides a display device including the above display panel, and the specific structure of the display panel is not described in detail here. Since the display device uses the display panel described above, the two can solve the same technical problems and have the same beneficial effects. The display device according to the embodiment of the present disclosure can be used in electronic devices such as a mobile phone, a tablet computer, or an electronic paper.

Those skilled in the art will readily contemplate other embodiments of the present disclosure after considering the specification and practicing the technical solutions disclosed herein. This application is intended to cover any adaptations, uses, or adaptations of this disclosure. These variations, uses, or adaptations follow the general principles of the present disclosure, and include common general knowledge or conventional technical means in the technical field not disclosed in the present disclosure. It is intended that the specification and examples be considered as exemplary only, the true scope and spirit of the present disclosure is indicated by the appended claims.

What is claimed is:

1. A stretchable display panel, comprising:
a flexible substrate and a plurality of pixel islands and island-to-island connections disposed on the flexible substrate, wherein the island-to-island connections are configured to connect adjacent pixel islands and the island-to-island connections comprise:
a first outer protective layer disposed on the flexible substrate;
a first inner protective layer disposed on a surface of the first outer protective layer facing away from the flexible substrate;
a conductive layer disposed on a part of a surface of the first inner protective layer facing away from the flexible substrate;
a second inner protective layer configured to cover the conductive layer and the first inner protective layer;
a second outer protective layer disposed on a surface of the second inner protective layer facing away from the flexible substrate; and
a packaging layer configured to cover the second outer protective layer;
wherein a Young's modulus of the first inner protective layer and the second inner protective layer are lower than that of the first outer protective layer and the second outer protective layer; and
wherein a Young's modulus of the first outer protective layer and the second outer protective layer are lower than that of the packaging layer.

2. The stretchable display panel according to claim 1, wherein the first inner protective layer and the second inner protective layer are both made of a material with elastic and hydrophobic properties.

3. The stretchable display panel according to claim 2, wherein the material of at least one of the first inner protective layer and the second inner protective layer comprises at least one of polydimethylsiloxane silicone and polyurethane.

4. The stretchable display panel according to claim 1, wherein a material of at least one of the first outer protective layer and the second outer protective layer comprises at least one of polyimide and naphthoquinone diazide compound.

5. The stretchable display panel according to claim 1, wherein materials of the first inner protective layer and the second inner protective layer are the same, and materials of the first outer protective layer and the second outer protective layer are the same.

6. The stretchable display panel according to claim 1, wherein a material of the packaging layer includes at least one of: silicon oxide, silicon oxynitride, and silicon nitride.

7. The stretchable display panel according to claim 1, wherein the pixel islands comprise:
an active layer disposed on the flexible substrate;

a gate insulating layer disposed on a side of the active layer facing away from the flexible substrate and configured to cover the active layer and the flexible substrate;

a gate disposed on a surface of the gate insulating layer facing away from the flexible substrate;

an interlayer insulating layer disposed on a surface of the gate facing away from the flexible substrate and configured to cover the gate and the gate insulating layer;

a source electrode, a drain electrode, and a signal line, which are disposed on a surface of the interlayer insulating layer facing away from the flexible substrate; and a light emitting layer configured to cover the source electrode, the drain electrode, the signal line, and the interlayer insulating layer.

8. A fabricating method of a stretchable display panel, comprising:

forming a flexible substrate on a substrate, the flexible substrate having a plurality of island regions and bridge regions connecting adjacent island regions;

forming a first outer protective layer on the bridge regions;

forming a first inner protective layer on a surface of the first outer protective layer facing away from the flexible substrate;

forming a conductive layer on a part of a surface of the first inner protective layer facing away from the flexible substrate;

forming a second inner protective layer covering the conductive layer and the first inner protective layer;

forming a second outer protective layer on a surface of the second inner protective layer facing away from the flexible substrate;

forming a packaging layer on a surface of the second outer protective layer facing away from the flexible substrate; and peeling the flexible substrate from the substrate;

wherein a Young's modulus of the first inner protective layer and the second inner protective layer are lower than that of the first outer protective layer and the second outer protective layer; and wherein a Young's modulus of the first outer protective layer and the second outer protective layer are lower than that of the packaging layer.

9. The fabricating method according to claim 8, wherein the first inner protective layer and the second inner protective layer are both made of a material with elastic and hydrophobic properties.

10. The fabricating method according to claim 9, wherein the material of at least one of the first inner protective layer and the second inner protective layer comprises at least one of polydimethylsiloxane silicone and polyurethane.

11. The fabricating method according to claim 8, further comprising:

forming an active layer in the island regions;

forming a gate insulating layer covering the active layer and the island regions;

forming a gate on a surface of the gate insulating layer facing away from the flexible substrate;

forming an interlayer insulating layer covering the gate and the gate insulating layer;

forming a source electrode, a drain electrode, and a signal line on a surface of the interlayer insulating layer facing away from the flexible substrate; and forming a light emitting layer covering the source electrode, the drain electrode, the signal line, and the interlayer insulating layer;

wherein the source electrode, the drain electrode, the signal line, and the conductive layer are formed by a same patterning process.

12. The fabricating method according to claim 8, wherein a material of at least one of the first outer protective layer and the second outer protective layer comprises at least one of polyimide and naphthoquinone diazide compound.

13. The fabricating method according to claim 8, wherein materials of the first inner protective layer and the second inner protective layer are the same, and materials of the first outer protective layer and the second outer protective layer are the same.

14. The fabricating method according to claim 8, wherein a material of the packaging layer includes at least one of silicon oxide, silicon oxynitride, and silicon nitride.

15. A display device, comprising a stretchable display panel which comprising:

a flexible substrate and a plurality of pixel islands and island-to-island connections disposed on the flexible substrate, wherein the island-to-island connections are configured to connect adjacent pixel islands and the island-to-island connections comprise:

a first outer protective layer disposed on the flexible substrate;

a first inner protective layer disposed on a surface of the first outer protective layer facing away from the flexible substrate;

a conductive layer disposed on a part of a surface of the first inner protective layer facing away from the flexible substrate;

a second inner protective layer configured to cover the conductive layer and the first inner protective layer;

a second outer protective layer disposed on a surface of the second inner protective layer facing away from the flexible substrate; and a packaging layer configured to cover the second outer protective layer;

wherein a Young's modulus of the first inner protective layer and the second inner protective layer are lower than that of the first outer protective layer and the second outer protective layer; and wherein a Young's modulus of the first outer protective layer and the second outer protective layer are lower than that of the packaging layer.

16. The display device according to claim 15, wherein the first inner protective layer and the second inner protective layer are both made of a material with elastic and hydrophobic properties.

17. The display device according to claim 16, wherein the material of at least one of the first inner protective layer and the second inner protective layer comprises at least one of polydimethylsiloxane silicone and polyurethane.

18. The display device according to claim 15, wherein a material of at least one of the first outer protective layer and the second outer protective layer comprises at least one of polyimide and naphthoquinone diazide compound.

19. The display device according to claim 15, wherein materials of the first inner protective layer and the second inner protective layer are the same, and materials of the first outer protective layer and the second outer protective layer are the same.

20. The display device according to claim 15, wherein a material of the packaging layer includes at least one of silicon oxide, silicon oxynitride, and silicon nitride.

* * * * *